United States Patent
LaMaster et al.

(10) Patent No.: US 7,115,924 B1
(45) Date of Patent: Oct. 3, 2006

(54) PIXEL WITH ASYMMETRIC TRANSFER GATE CHANNEL DOPING

(75) Inventors: Fredrick P. LaMaster, Fort Collins, CO (US); John H. Stanback, Fort Collins, CO (US); Chintamani P. Palsule, Fort Collins, CO (US); Thomas E. Dungan, Fort Collins, CO (US)

(73) Assignee: Avago Technologies Sensor IP Pte. Ltd., Singapore (SG)

( * ) Notice: Subject to any disclaimer, the term of this patent is extended or adjusted under 35 U.S.C. 154(b) by 0 days.

(21) Appl. No.: 11/144,304

(22) Filed: Jun. 3, 2005

(51) Int. Cl.
*H01L 31/62* (2006.01)
*H01L 21/00* (2006.01)

(52) U.S. Cl. .................. 257/291; 257/292; 438/60; 438/199

(58) Field of Classification Search ............... 257/233, 257/239, 291, 292; 438/48, 60, 199, 286
See application file for complete search history.

(56) References Cited

U.S. PATENT DOCUMENTS

| | | | |
|---|---|---|---|
| 5,625,210 A | | 4/1997 | Lee et al. |
| 5,880,495 A | | 3/1999 | Chen |
| 6,100,551 A | | 8/2000 | Lee et al. |
| 6,127,697 A | | 10/2000 | Guidash |
| 6,184,055 B1 | | 2/2001 | Yang et al. |
| 6,329,233 B1 * | 12/2001 | Pan et al. ............ | 438/199 |
| 6,630,701 B1 * | 10/2003 | Rhodes .............. | 257/292 |
| 6,730,899 B1 | | 5/2004 | Stevens et al. |
| 6,740,915 B1 * | 5/2004 | Rhodes .............. | 257/291 |
| 6,818,930 B1 * | 11/2004 | Mouli et al. ........ | 257/215 |
| 6,902,945 B1 * | 6/2005 | Mann et al. ........ | 438/48 |
| 7,030,433 B1 * | 4/2006 | Mimuro et al. ..... | 257/290 |
| 2005/0006676 A1 * | 1/2005 | Watanabe ........... | 257/290 |

OTHER PUBLICATIONS

Kuo, James B., et al., "MOS Pass Transistor Turn-Off Transient Analysis," IEEE Transactions on Electron Devices, vol. ED-35, No. 10, Oct. 1986, pp. 1545-1555.
Inoue, Ikuko et al., "Low-Leakage-Current and Low-Operating-Voltage Buried Photodiode for a CMOS Imager," IEEE Transactions on Electron Devices, vol. 50, No. 1, Jan. 2003, pp. 43-47.
Mitsuyoshi, Mori et al., "1 / 4-Inch 2-Mpixel MOS Image Sensor with 1.75 Transistor/Pixel," IEEE Journal of Solid-State Circuits, vol. 39, No. 12, Dec. 2004, pp. 2426-2430.
Mabuchi, Keiji et al., "CMOS Image Sensors Comprised of Floating Diffusion Driving Pixels with Buried Photodiode," IEEE Journal of Solid-State Ciruits, vol. 39, No. 12, Dec. 2004, pp. 2408-2416.
Takahashi, Hidekazu et al., "A 3.9-um Pixel Pitch VGA Format 10-b Digital Output CMOS Image SEnsor with 1.5 Transistor/Pixel," IEEE Journal of Solid-State Circuits, vol.39, No. 12, Dec. 2004, pp. 2417-2425.

* cited by examiner

*Primary Examiner*—T. N. Quach

(57) ABSTRACT

A pixel including a substrate of a first conductivity type, a photodetector of a second conductivity type that is opposite the first conductivity type and configured to convert incident light to a charge, a floating diffusion of the second conductivity, and a transfer region between the photodetector and floating diffusion. A gate is formed above the transfer region and partially overlaps the photodetector and is configured to transfer charge from the photodetector to the floating diffusion. A pinning layer of the first conductivity type extends at least across the photodetector from the gate. A channel region of the first conductivity type extends generally from a midpoint of the gate at least across the photodiode and is formed by an implant of a dopant of the first conductivity and having a concentration such that a dopant concentration of the transfer region is greater proximate to the photodetector than proximate to the floating diffusion.

26 Claims, 5 Drawing Sheets

PIXEL WITH ASYMMETRIC TRANSFER GATE CHANNEL DOPING

BACKGROUND

Digital cameras employing complementary metal-oxide semiconductors (CMOS) image sensors having 4-transistor pixel structures with buried, gated diodes generally provide better image quality than their counterparts employing 3-transistor CMOS image sensors because the buried photodiode configuration reduces the amount of surface generated current which reduces dark current, and because the transfer gate used to access the photodiode enables the use of correlated double sampling which reduces noise. However, as described below, dark current can be generated in regions of the pixel in addition to the photodiode.

A 4-transistor pixel typically includes a photodiode, a charge-to-voltage conversion region ("floating diffusion"), and a charge transfer region. The photodiode and floating diffusion are built in a substrate (e.g. silicon) with the charge transfer region typically being a MOSFET ("transfer gate") positioned between the diode and floating diffusion.

The pixel has two modes of operation, a charge collection or integration mode and a charge transfer or readout mode. Prior to integration, the floating diffusion is set to a "high" voltage and the transfer gate is turned on so as to extract all electrons from the photodiode so that is becomes "fully depleted." During integration, the transfer gate is held at a low voltage (e.g. ground) and the diode is exposed to light and collects photo-generated electrons. At the conclusion of the integration period, during the readout mode, the floating diffusion is again set to a "high" voltage and the transfer gate is turned on so that electrons are transferred from the photodiode to the floating diffusion via the charge transfer region.

The charge transfer region is essentially the channel region of a "normally off" or enhancement-mode type NMOSFET. During integration, the transfer gate is "turned off." However, even though the transfer gate is turned off, current can be generated in surface of the channel region, particularly in the region closest to the photodiode. This current contributes to dark current and is generated by sources other than incident light (e.g. heat). Because of its proximity to the photodiode, this dark current may leak into the photodiode during integration, thereby resulting in "noise" and limiting the pixel's imaging performance.

To reduce dark current generated in this region, one type of pixel structure employs a charge transfer region having a surface region extending essentially along an entire length and width of the transfer gate that is implanted with a dopant that enhances the conductivity of the charge transfer region relative to the substrate. By enhancing the conductivity in this fashion, the surface region of the charge transfer region is accumulated with "holes" when the transfer gate is held at the low-voltage level so as to quench dark current generation in this area.

Image quality can also be adversely affected by incomplete charge transfer from the photodiode to the floating diffusion and by subsurface leakage current. During the charge transfer cycle, the transfer gate voltage is set "high." As charge is transferred from the photodiode to the floating diffusion, the potential of the floating diffusion begins to fall while the potential of the photodiode begins to rise. If the floating diffusion potential drops to the level of the transfer gate channel surface potential, some of the charge being transferred from the photodiode may remain in the transfer gate channel region until the end of the charge transfer cycle when the transfer gate voltage is dropped toward ground. At this point, some these charges (i.e. electrons) may return to the photodiode rather than be transferred to the floating diffusion. This is sometimes referred to as "spill-back" or "slosh-back." This incomplete charge transfer can affect the amount of charge accumulated and transferred during the next integration period, producing image lag or temporal noise.

Subsurface leakage occurs during integration when electrons move from the photodiode region to the floating diffusion. Such leakage will result in an inaccurate reading of the amount of charge collected during an integration period, thereby reducing the image quality.

While the above described structure is generally effective at reducing dark current by implanting the whole of the charge transfer region with a dopant to enhance its conductivity relative to the substrate, such a structure does not address issues of subsurface leakage current and image lag due to charge spill-back.

SUMMARY

In one aspect, the present invention provides a pixel including a substrate of a first conductivity type, a photodetector of a second conductivity type that is opposite the first conductivity type and configured to convert incident light to a charge, a floating diffusion of the second conductivity, and a transfer region between the photodetector and floating diffusion. A gate is formed above the transfer region and partially overlaps the photodetector and is configured to transfer charge from the photodetector to the floating diffusion. A pinning layer of the first conductivity type extends at least across the photodetector from the gate. A channel region of the first conductivity type extends generally from a midpoint of the gate at least across the photodiode and is formed by an implant of a dopant of the first conductivity and having a concentration such that a dopant concentration of the transfer region is greater proximate to the photodetector than proximate to the floating diffusion.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
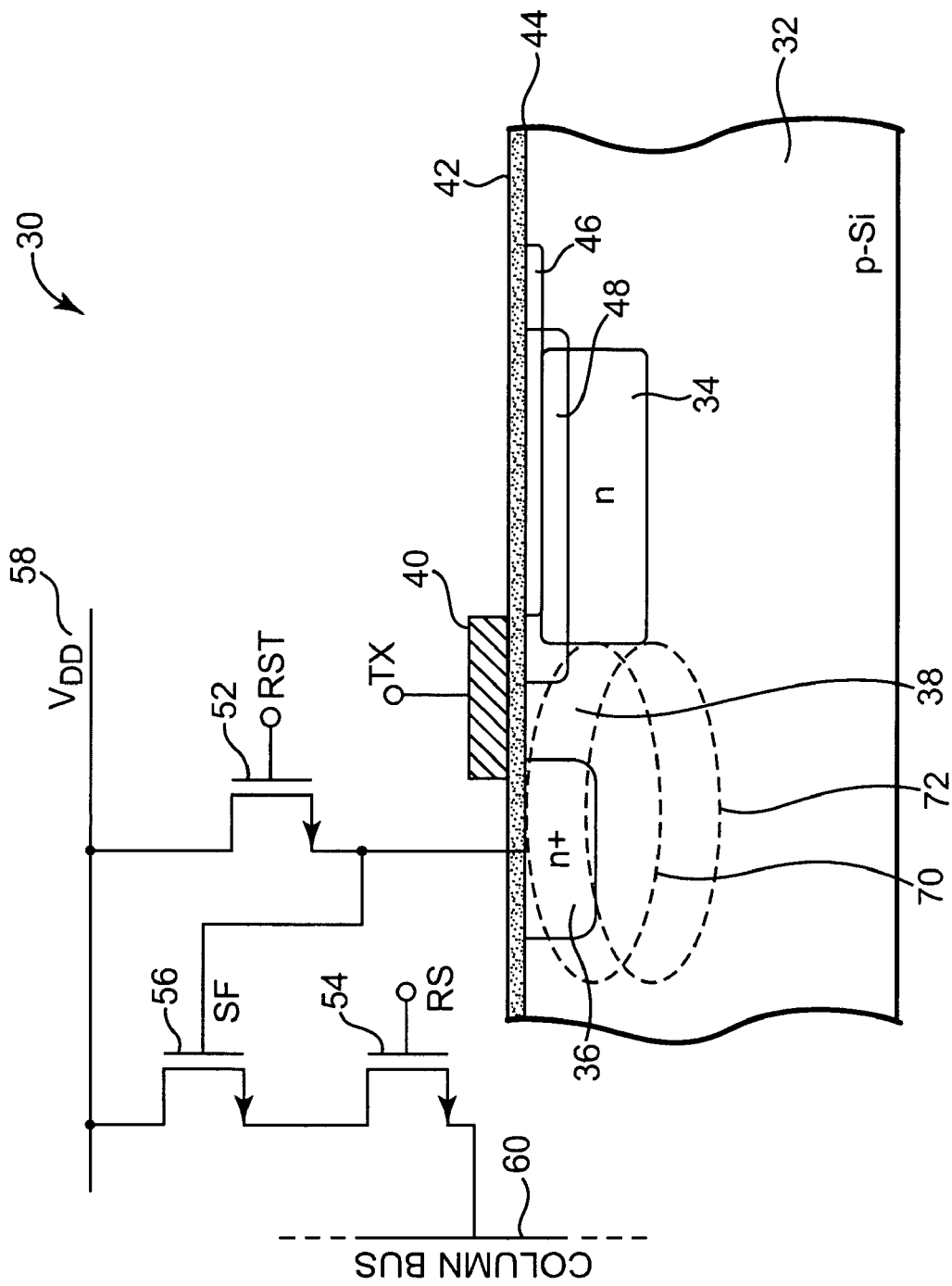
FIG. 1 is a block and schematic diagram illustrating one embodiment of a pixel according to the present invention.

FIG. 1 is a block diagram and schematic diagram illustrating generally one embodiment of CMOS pixel 30 employing asymmetric channel doping according to the present invention. Pixel 30 includes a substrate 32 of a first conductivity type, and photodetector 34 formed from an implant of a second conductivity type, which is opposite the first conductivity type, and is configured to collect and convert incident light to a charge during an integration period. Photodetector 34 may be a photodiode or a pinned-photodiode. CMOS pixel 30 as illustrated is commonly referred to as a 4-transistor, buried-gated photodiode type pixel, wherein photodetector 34 comprises a pinned-photodiode.

A floating diffusion region 36 is formed in substrate 32 of an implant having the second conductivity type. A transfer region 38 of substrate 32 extends between photodiode 34 and floating diffusion 36. A transfer gate (TX) 40 (sometimes referred to as an access transistor) is formed above transfer region 38 and at least partially overlaps photodiode 34. An insulating layer 42 separates TX gate 40 from a surface 44 of substrate 32. A pinning layer 46 of the first conductivity type is positioned generally between surface 44 and photodetector 34 and extends from TX gate 40 at least across photodiode 34.

A channel region 48 of enhanced conductivity type relative to substrate 32 is at least partially coincident with and at least partially at a depth greater than pinning layer 46. Channel region 48 extends generally from a midpoint of TX gate 40 to at least across photodiode 34 such that channel region 48 forms a junction with photodiode 34. Channel region is formed with a dopant concentration such that a dopant concentration of transfer region 38 is greater proximate to photodiode 34 than proximate to floating diffusion 36. In effect, transfer region 38 is asymmetrically doped with a dopant of the same conductivity type as substrate 32 with the dopant concentration being greater adjacent to photodiode 34 than adjacent to floating diffusion 36.

In one embodiment, as illustrated, substrate 32 is of p-type conductivity (e.g. p-type silicon) and photodiode 34 and floating diffusion 36 are of n-type conductivity. In one embodiment, pinning layer 46 and channel region 48 include additional dopant of the same type as substrate 32, p-type as illustrated. In one embodiment, the dopant of substrate 32, pinning layer 46, and channel region 48 comprises boron. In one embodiment, the dopant of substrate 32, pinning layer 46, and channel region 48 is selected from the group consisting of boron, aluminum, gallium, and indium. In one embodiment, the dopant of photodiode 34 and floating diffusion 36 comprise phosphorous. In one embodiment, the dopant of photodiode 34 and floating diffusion area is selected from the group consisting of phosphorous and arsenic.

Pixel 30 further includes a reset (RST) transistor 52, a row select (RS) transistor 54, and a source-follower (SF) transistor 56. The source of reset transistor 52 is coupled to floating diffusion 36 and the drain is coupled to a voltage source ($V_{DD}$) 58. The gate of SF transistor 56 is coupled to the source of RST transistor 52 and the drain is coupled to $V_{DD}$ 58. The drain of RS 54 is coupled to the source of SF transistor 56 and the gate is coupled to a column bus 60 of an array of image sensor to which pixel 30 is associated.

Pixel 30 operates essentially in two modes, integration and readout. Initially, pixel 30 is in a reset state, with TX gate 40 and RST gate 52 turned on so as to remove charge from photodiode 34 and floating diffusion 36. To begin integrating, TX gate 40 and RST transistor 52 are turned off. During integration, photodiode 34 collects photo-generated electrons having a charge that is proportional to an amount of photon flux incident upon photodiode 34. The amount of accumulated charge is representative of the intensity of light incident up photodiode 34. During integration, the boron implants of channel region 48 and pinning layer 46 function as a barrier to prevent carrier generation near surface 44.

After pixel 30 has integrated charge for a desired period, RST transistor 52 is turned on and floating diffusion 36 is set to a level approximately equal to $V_{DD}$ 58. In one embodiment, $V_{DD}$ 58 is in a range from 2.5 volts to 5 volts. In one embodiment, $V_{DD}$ 58 is approximately 3.3 volts. The reset level of floating diffusion 36 is then sampled at column bus 60 via RS transistor 54 and SF transistor 56, with the reset level being approximately equal to $V_{DD}$ 58 minus a threshold value.

Subsequently, the voltage on TX gate 40 is set high forming an inversion layer in transfer region 38 and causing transfer region 38 to become conductive. As a result, electrons accumulated by photodiode 34 begin to be transferred to from the lower voltage photodiode 34 to the higher voltage floating diffusion 36 via transfer region 38 causing the voltage level of floating diffusion 36 to drop. At the end of the transfer period, the TX gate 40 is returned to ground to isolate photodiode 34 for the next integration period. The "accumulated" voltage level of floating diffusion 36 is then read at column bus 60 via RS transistor 54 and SF transistor 56. The difference between the sampled reset level and the accumulated voltage level constitutes an image signal that is proportional to the intensity of light incident upon photodiode 34. The process of comparing the sampled reset level to the accumulated voltage level is generally referred to as "double sampling."

During the readout period, as electrons are transferred from photodiode 34 to floating diffusion 36, the potential of floating diffusion 36 begins to drop from the reset level while the potential of photodiode 32 begins to rise. If the potential difference between photodiode 34 and floating diffusion 36 is not substantial when TX gate 40 is returned to ground, electrons located in transfer region 38, and possibly electrons in floating diffusion 36, may return to photodiode 34 and not be included in the image signal. The return of photo-generated electrons to the photodiode in this fashion is sometimes referred to as charge "slosh-back." Such slosh-back results in "image lag", wherein the returning electrons of the present integration period are included with photo-generated electrons of the next integration period, thereby reducing image quality.

The asymmetric doping of transfer region 38 resulting from implantation of channel region 48 in accordance with the present invention is configured to reduce and/or eliminate such charge slosh-back. During operation of pixel 30, the implanted p-type dopants, such as boron, for example, are negatively charged immobile ions. Because of the asymmetry of the dopant implants, the higher concentrations of dopant adjacent to photodiode 34 create an electrostatic potential in transfer region 38 adjacent to photodiode 34 that is lower than an electrostatic potential adjacent to floating diffusion 36 created by the lower concentrations of dopant adjacent to floating diffusion 36. As a result, photo-generated electrons in transfer region 38 flow to the higher potential and, thus, to floating diffusion 36 when the voltage of TX gate 40 is returned to ground from a high voltage at completion of the charge transfer process.

In effect, the asymmetrical doping of transfer region 38 "pushes" photo-generated electrons to floating diffusion 36, with the higher dopant concentrations of channel region 48 forming a barrier to photodiode 48 from transfer region 38. It should be noted that by extending channel region 48 from transfer region 38 to at least across photodiode 32, channel region 48 presents a substantially uniform potential to photodiode 34. As such, the likelihood of channel region 48 being a potential barrier to electron flow from photodiode 34 during the charge transfer process is reduced and electrons are able to flow freely to floating diffusion 36.

It should also be noted that while some pixel structures include surface doping of the transfer region, such doping is generally symmetrical across the transfer region so as to reduce generation of dark current in the transfer region. As such, the symmetrical surface doping of the transfer regions of conventional pixel structures does not reduce charge slosh-back as does the asymmetric doping of transfer region 38 according to the present invention.

In one embodiment, pixel 30 further includes an asymmetric anti-punchthrough implant of the same conductivity as substrate 32. In one embodiment, the anti-punchthrough implant comprises boron. In one embodiment, as illustrated, the asymmetric anti-punchthrough implant includes a medium anti-punchthrough implant 70 and a deep anti-punchthrough implant 72 as represented generally by the dashed lines in FIG. 1. In one embodiment, the medium and deep anti-punchthrough implants 70 and 72 are implanted such that the doping extends from approximately the center of TX gate 40 into floating diffusion region 36, thereby making the anti-punchthrough implants asymmetric across the width of pixel 30.

The use of anit-punchthrough implants is known and employed in some conventional pixel structures to reduce subsurface leakage of electrons generated from incident light in the region of the photodiode to the floating diffusion region. Such leakage of photo-generated electrons to the floating diffusion will result in an inaccurate image signal since not all photo-generated electrons will be collected by the phototodetector and, consequently, not included and measured as part of the charge transfer process.

While anti-punchthrough implants of conventional pixel structures are generally effective at reducing sub-surface leakage, such implants are generally symmetrically implanted across the pixel including in the region of the photodetector. Thus, although effective at reducing sub-surface leakage, the implants in the region of the photodetector can interfere with the collection of photo-generated electrons by the photodetector, particularly those electrons generated deeper in the substrate.

On the other hand, the medium and deep anti-punchthrough implants 70 and 72 of the present invention are asymmetrically implanted such that concentrations of implanted dopant (e.g. boron) are greater proximate to floating diffusion 36 than concentrations adjacent to photodiode 34. In a fashion similar to that described above with respect to transfer region 38, the higher concentrations of dopant proximate to floating diffusion 36 create a lower electrostatic potential relative to the lower concentrations of dopant adjacent to photodiode 34. As such, medium and deep asymmetrical anti-punchthrough implants 70 and 72 act as an electron barrier to floating diffusion 36 and "push" photo-generated electrons toward photodiode 34. Furthermore, since medium and deep anti-punchthrough implants 70 and 72 generally do not extend into photodiode 34, they do not interfere with the collection of photo-generated electrons as do conventional symmetrical anti-punchthrough implants.

In summary, by creating an asymmetrical doping of transfer region 38 through use of channel region 48 according to the present invention, pixel 30 reduces the occurrence of charge slosh-back, thereby improving image quality by reducing the effects of image lag. Additionally, by employing asymmetrical anti-punchthrough implants 70 and 72 in accordance with the present invention, pixel 30 further improves image by reducing sub-surface leakage of electrons without interfering with the collection of photo-generated electrons by photodiode 34.

Figure 2:
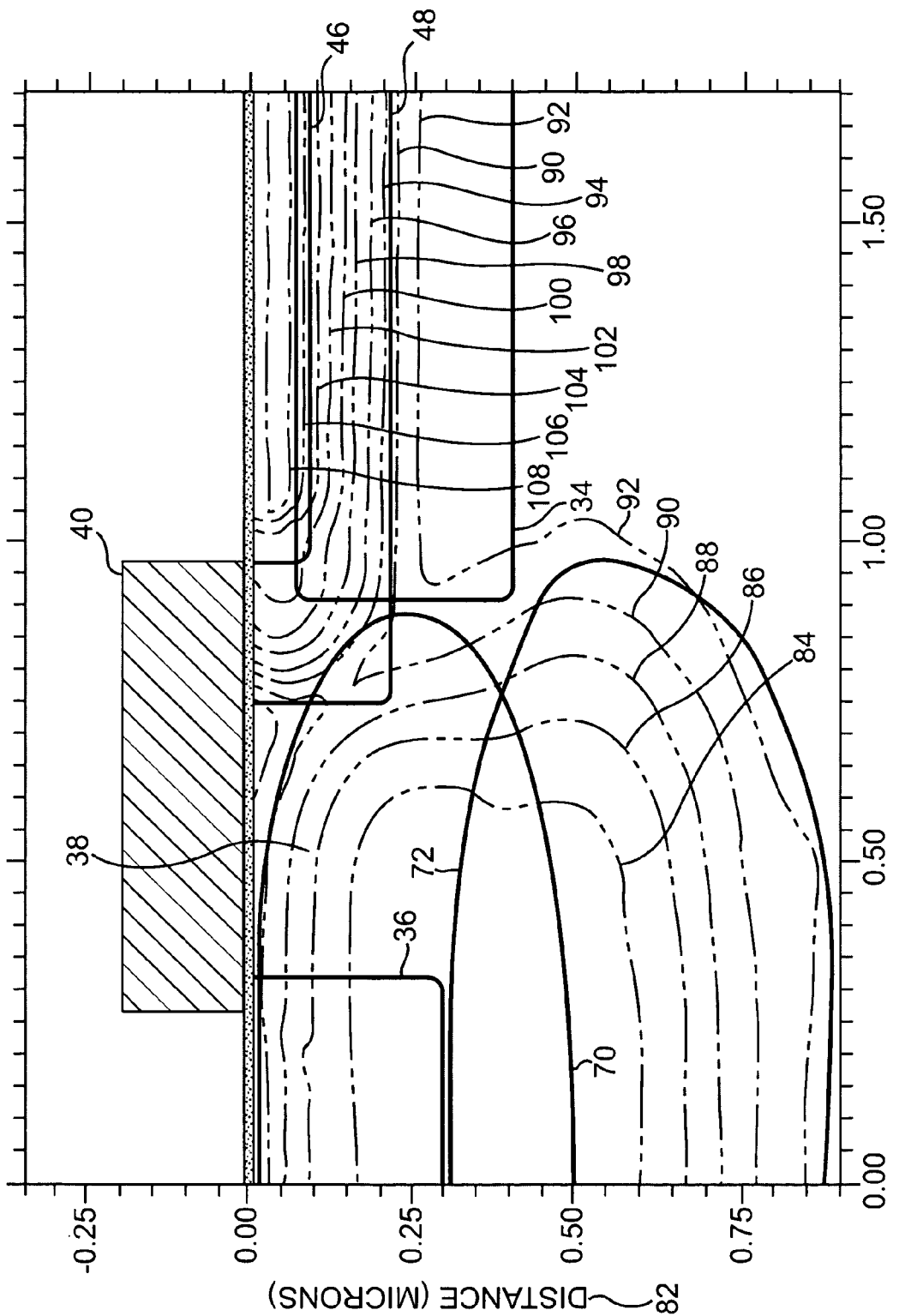
FIG. 2 is a cross-sectional view of a portion of the pixel of FIG. 1 illustrating example dopant concentration contours.

FIG. 2 is a cross-sectional view of a portion of pixel 30 of FIG. 1 illustrating example contours of boron concentration levels in substrate 32 used to create the asymmetrically doping of transfer region 38 and anti-punchthrough implants 70 and 72. The distance (as measured in microns) across the width of pixel is indicated along the x-axis at 80, and the depth (as measured in microns) below surface 44 of pixel 30 is indicated along the y-axis as indicated at 82.

In FIG. 2, photodiode 34, floating diffusion 36, pinning layer 46, channel region 48, and medium and deep anti-punchtrhrough implants 70 and 72 are illustrated with solid lines, while boron contour lines 84 through 108 are illustrated with hidden lines. Although the boundaries of photodiode 34 are illustrated by FIGS. 1 and 2 as being generally perpendicular to surface 44 of substrate 32, in one embodiment, the edge of the implant forming photodiode 34 which is proximate to TX gate 40 is angled generally toward a middle region of TX gate 40 such that photodiode 34 angularly extends below TX gate 40.

Implant concentrations are typically measured in terms of the number of implanted dopant atoms per cubic centimeter ($cm^3$) of volume of the substrate. In one embodiment, boron contour line 84 represents a region having a boron concentration of $4.6 \times 10^{16}$ boron atoms per cubic centimeter of substrate 32 ($4.6e16/cm^3$), contour line 86 a boron concentration of $2e16/cm^3$, contour line 88 a boron concentration of $1e16/cm^3$, contour line 90 a boron concentration of $4.6e15/cm^3$, contour line 92 a boron concentration of $2e15/cm^3$, contour line 94 a boron concentration of $1e16/cm^3$, contour line 96 a boron concentration of $2e16/cm^3$, contour line 98 a boron concentration of $4.6e16/cm^3$, contour line 100 a boron concentration of $1e17/cm^3$, contour line 102 a boron concentration of $2e17/cm^3$, contour line 104 a boron concentration of $4.6e17/cm^3$, contour line 106 a boron concentration of $1e18/cm^3$, and contour line 108 a boron concentration of $2e18/cm^3$.

In the example illustrated by FIG. 2, it can be seen that the boron concentrations of channel region 46 together with the boron concentrations of medium and deep anti-punchthrough implants 70 and 72 provide a transfer region 38 having a higher boron concentration adjacent to photodiode 34 than to floating diffusion 36, and anti-punchthrough implants having higher boron concentrations in the region of floating diffusion 36 than adjacent to photodiode 34.

It is noted that the boron concentrations illustrated by FIG. 2 represent a specific implementation of pixel 30. Other concentrations of boron and other dopant implants can also be employed. In one embodiment, the implant concentrations are such that the dopant concentration of transfer region 38 proximate to photodiode 34 is in a range from $1.5 \times 10^{18}/cm^3$ to $4.5 \times 10^{18}/cm^3$. In one embodiment, the implant concentrations are such that the dopant concentration of transfer region 38 proximate to floating diffusion 36 is in a range from $7.0 \times 10^{15}/cm^3$ to $1.3 \times 10^{16}/cm^3$. In one embodiment, the implant concentrations are such that a ratio of the dopant concentration proximate to photodiode 34 to the dopant concentration proximate to floating diffusion 36 is in a range approximately from 150 to 650.

Figure 3A:
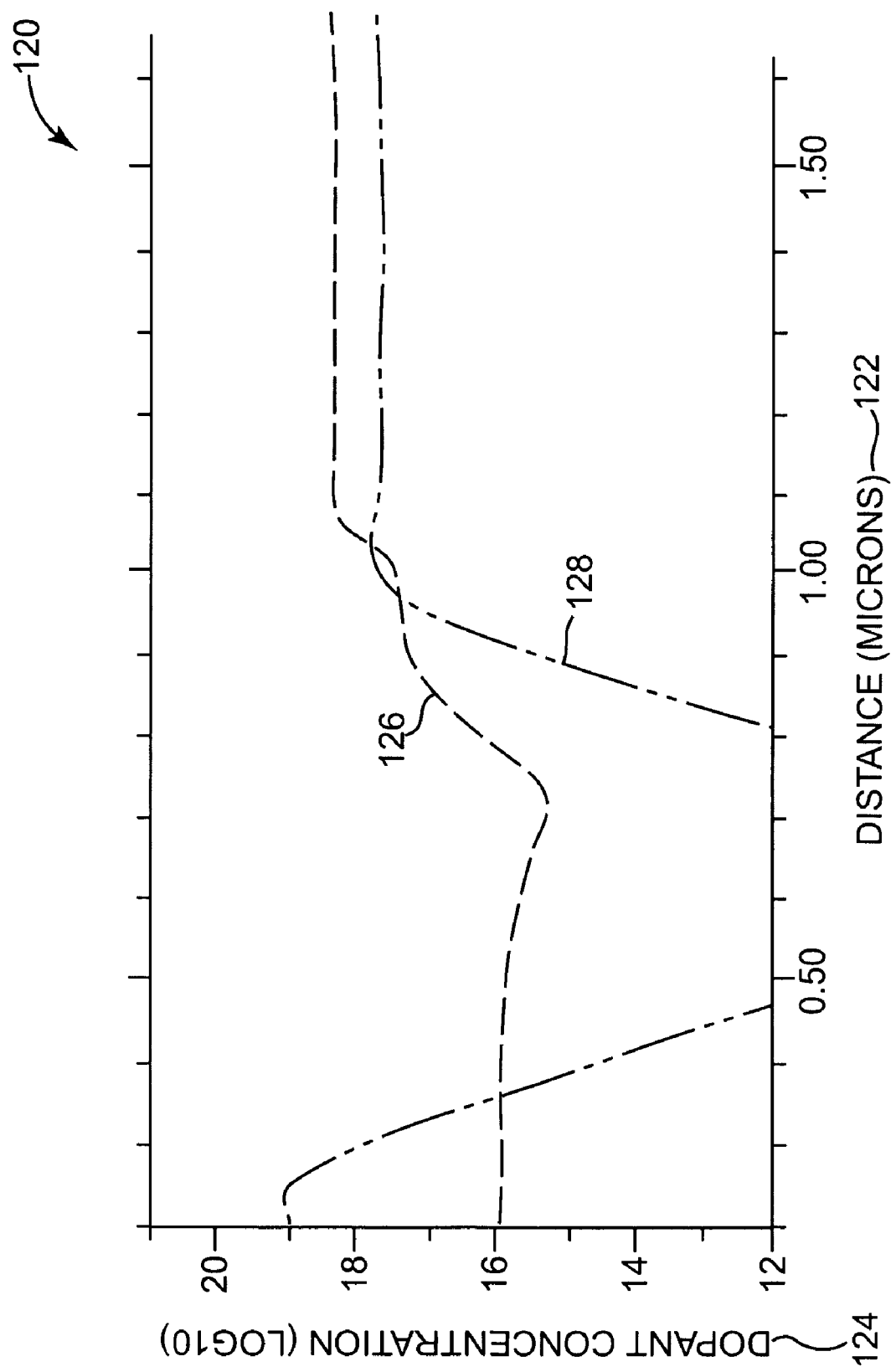
FIG. 3A is a graph illustrating example concentrations of implanted boron and phosphorous at a constant depth across the pixel of FIG. 2.

FIG. 3A is a graph 120 illustrating example boron concentrations at a constant depth of approximately 0.05 microns across a width pixel 30 from 0.30 microns to 1.50 microns. The distance (in microns) across the width of pixel 30 is illustrated along the x-axis at 122 and the implant concentration is illustrated along the y-axis at 124. The boron concentration level is indicated by curve 126. A phosphorous concentration level is indicated by curve 128. For purposes of clarity, phosphorous contour lines were not illustrated in FIG. 2. However, the n-type phosphorous implants are illustrated in FIG. 3A to illustrate the relationship between the boron implants and the phosphorous implants used to form photodiode 34 and floating diffusion 36.

Figure 3B:
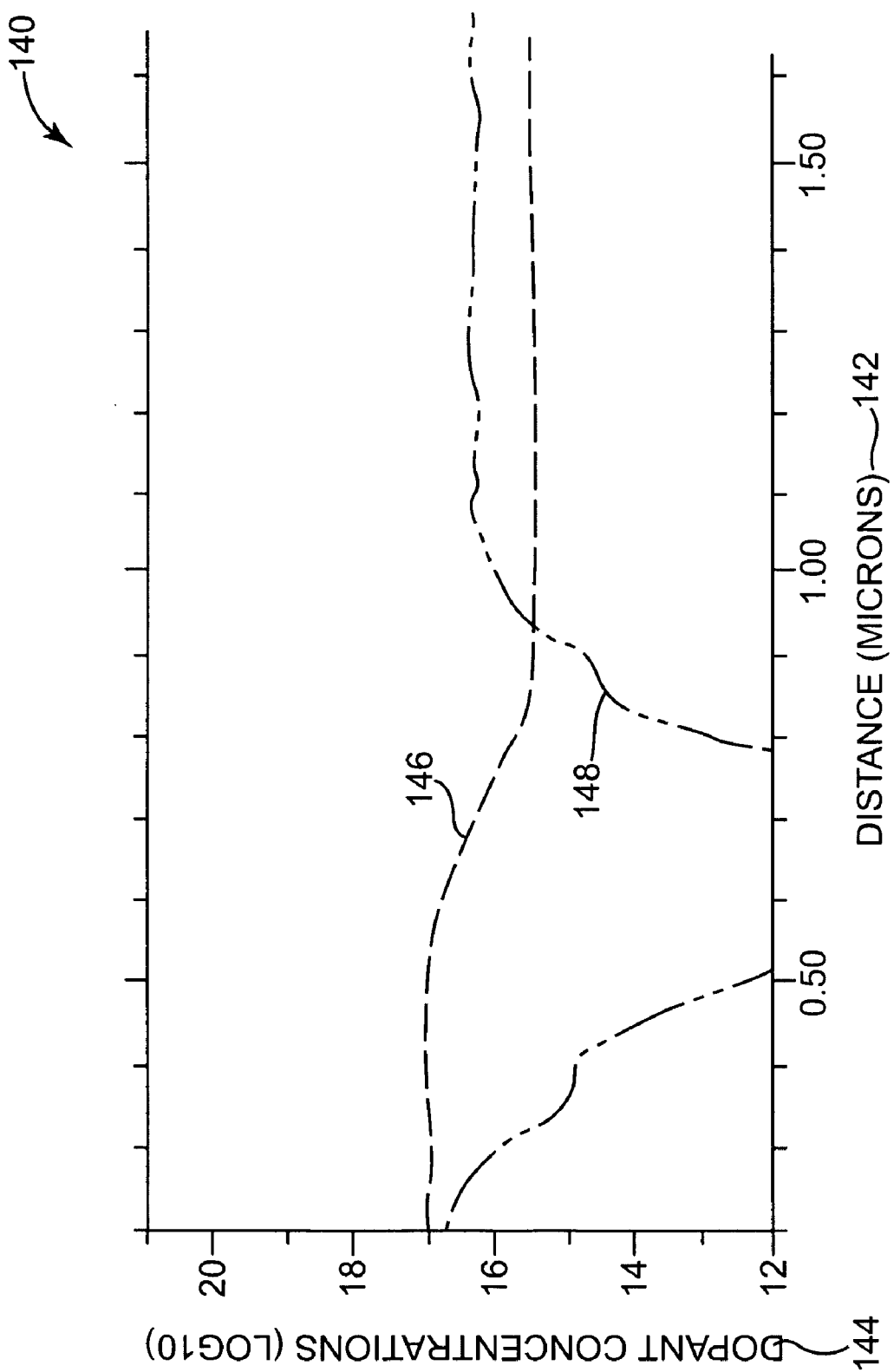
FIG. 3B is a graph illustrating example concentrations of implanted boron and phosphorous at a constant depth across the pixel of FIG. 2.

FIG. 3B is a graph 140 illustrating example boron concentrations at a constant depth of approximately 0.25 microns across a width pixel 30 from approximately 0.30 microns to 1.50 microns. The distance (in microns) across the width of pixel 30 is illustrated along the x-axis at 142 and the implant concentration is illustrated along the y-axis at 144. The boron concentration level is indicated by curve 146. A phosphorous concentration level is indicated by curve 148. For purposes of clarity, phosphorous contour lines were not illustrated in FIG. 2. However, the n-type phosphorous implants are illustrated in FIG. 3B to illustrate the relationship between the boron implants and the phosphorous implants used to form photodiode 34 and floating diffusion 36.

Figure 3C:
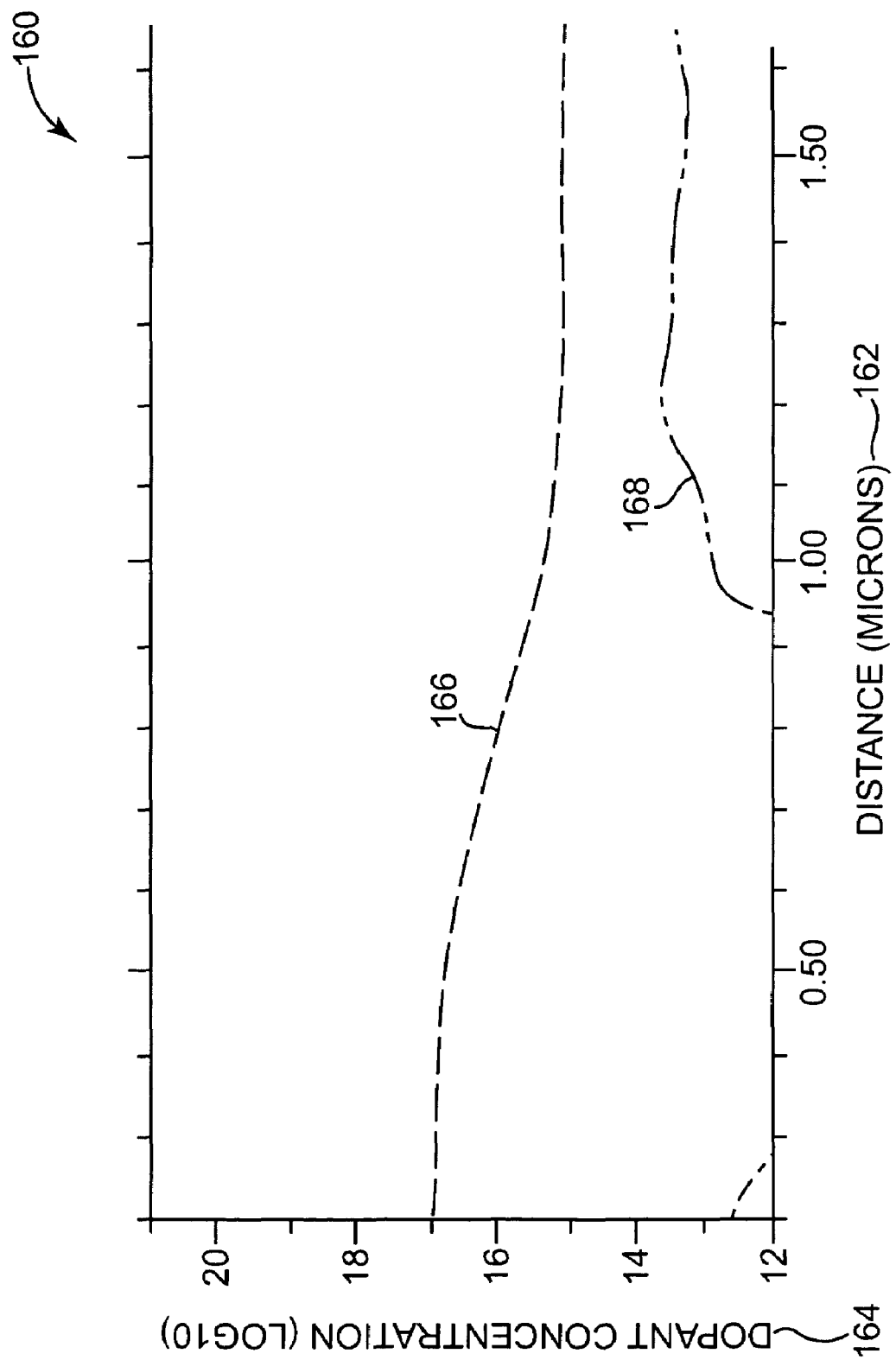
FIG. 3C is a graph illustrating example concentrations of implanted boron and phosphorous at a constant depth across the pixel of FIG. 2.

FIG. 3C is a graph 160 illustrating example boron concentrations at a constant depth of approximately 0.5 microns across a width pixel 30 from 0.30 microns to 1.50 microns. The distance (in microns) across the width of pixel 30 is illustrated along the x-axis at 162 and the implant concentration is illustrated along the y-axis at 164. The boron concentration level is indicated by curve 166. A phosphorous concentration level is indicated by curve 168. For purposes of clarity, phosphorous contour lines were not illustrated in FIG. 2. However, the n-type phosphorous implants are illustrated in FIG. 3A to illustrate the relationship between the boron implants and the phosphorous implants used to form photodiode 34 and floating diffusion 36.

It should be noted that the implantation of channel region 48 and anti-punchthrough regions 70 and 72 of the present invention comprises a two step masking operation. A first mask is employed in the formation of channel region 48 and a second mask is employed in the formation of medium and deep anti-punchthrough implants 70 and 72. In one embodiment, a boron ion beam is employed to implant the boron atoms in the formation of pinning layer 46, channel region 48, and medium and deep anti-punchthrough implants 70 and 72. In one embodiment, pinning layer 46 is formed with a boron ion beam having an energy level of approximately 20 KeV and channel region 48 is formed with a boron ion beam having an energy level of approximately 41 KeV. Similarly, deep anti-punchthrough implant 72 is formed with an boron ion beam having a higher energy level than that used to form medium anti-punchthrough implant 70. In one embodiment, medium anti-punchthrough implant 70 has a peak boron concentration at a depth of 0.3 microns from surface 44 and deep anti-punchtrough implant 72 has a peak boron concentration at a depth of 0.6 microns from surface 44.

Generally, to reduce costs and manufacturing time, the transfer region implants and anti-punchthrough implants of conventional pixel structures are formed using the same mask. Thus, when using the same mask, great care must be taken to properly align the mask since the transfer region implant is desired to be as close as possible to the photodiode to reduce dark current while the anti-punchthrough implant is desired to be spaced at least some distance from the photodiode to prevent interference with its operation. As such, aligning the mask optimally is a problem. Furthermore, because the same mask is used for both implants and because it is desired to implant the transfer region with a symmetrical implant to reduce dark current, the anti-punchthrough implant is symmetrical as well. As described earlier, such a symmetrical configuration can interfere with collection of photogenerated electrons by the photodiode.

By using two masks, one in the formation of channel region 48 and one in the formation of medium and deep anti-punchtrough implants 70 and 72, the present invention avoids these problems. The first mask can be optimally placed to form channel region 48 and the second mask can be optimally placed to form anti-punchthrough implants 70 and 72. Furthermore, anti-punchtrough implants 70 and 72 are not limited to being symmetrical across a width of pixel 30.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A pixel comprising:
   a substrate of a first conductivity type;
   a photodetector of a second conductivity type that is opposite the first conductivity type and configured to convert incident light to a charge;
   a floating diffusion of the second conductivity;
   a transfer region between the photodetector and floating diffusion;
   a gate formed above the transfer region and partially overlapping the photodetector and configured to transfer the charge from the photodetector to the floating diffusion;
   a pinning layer of the first conductivity type extending at least across the photodetector from the gate; and
   a channel region of the first conductivity type extending generally from a midpoint of the gate at least across the photodetector, wherein the channel region is formed by an implant of a dopant of the first conductivity and having a concentration such that a dopant concentration of the transfer region is greater proximate to the photodetector than proximate to the floating diffusion.

2. The pixel of claim 1, wherein the photodetector comprises a photodiode, and wherein the channel region is at least partially coincident with and at a depth greater than the pinning layer and forms a junction with the photodiode.

3. The pixel of claim 1, wherein the charge comprises electrons and the dopant contains immobile negatively charged ions, and wherein during a charge transfer process when the gate is energized the negatively charged ions of the higher dopant concentration proximate to the photodetector create an electrostatic potential lower than an electrostatic potential created by the negatively charged ions of lower dopant concentration proximate to the floating diffusion such that higher dopant concentration forms a barrier to the photodetector and electrons in the transfer region flow to the floating diffusion when the gate is de-energized.

4. The pixel of claim 1, wherein the dopant concentration generally increases from substantially a midpoint of the gate to an overlap region of the gate and the photodetector.

5. The pixel of claim 1, wherein the dopant concentration is at a first level in an overlap region of the gate and floating diffusion, at a second level which is incrementally less than the first level in a middle region of the gate, and at a third level which is greater than the first level at an overlap region of the gate and photodetector.

6. The pixel of claim 5, wherein the dopant concentration is substantially at the third level across a length and width of the photodetector beyond the overalp region with the gate so as to form at least a portion of a pinning layer between the photodetector and the surface of the substrate.

7. The pixel of claim 5, wherein the dopant concentration is substantially at the first level across a length and width of the floating diffusion beyond the overlap region with the gate.

8. The pixel of claim 1, including an asymmetric anti-punchthrough implant extending generally from a midpoint of the gate into the floating diffusion, wherein the anti-punchthrough implant is formed by an implant of a dopant of the first conductivity and having a concentration such that a concentration of the dopant proximate to the floating diffusion is greater than a concentration of the dopant proximate the midpoint of the gate.

9. The pixel of claim 8, wherein the charge comprises electrons and the greater dopant concentration proximate to the floating diffusion region is configured to act as a barrier to prevent electrons from leaking to the floating diffusion region from the photodetector during an integration period of the active pixel sensor and the lesser dopant concentration proximate to the photodetector is configured to reduce interference of the dopant with electron collection by the photodetector during the integration period.

10. The pixel of claim 1, wherein the photodetector is formed by an implant of the second conductivity type where an edge of the photodetector implant proximate to the gate is angled relative to a surface of the substrate and generally toward a middle region of the gate such that the photodetector angularly extends below the gate.

11. The pixel of claim 1, wherein the first conductivity type is p type.

12. The pixel of claim 1, wherein the dopant is selected from the group consisting of boron, aluminum, gallium, and indium.

13. The pixel of claim 1, wherein a dopant concentration of the surface channel proximate to the photodetector is within a range from approximately 1.5e18 to 4.5e18.

14. The pixel of claim 1, wherein a dopant concentration of the surface channel proximate to the floating diffusion region is within a range from approximately 7.0e15 to 1.3e16.

15. The pixel of claim 1, wherein a ratio of the dopant concentration proximate to the photodetector to the dopant concentration relative to the floating diffusion region is within a range approximately from 150 to 650.

16. A pixel comprising:
a substrate of a first conductivity type;
a photodetector formed from an implant of a second conductivity type which is opposite the first conductivity type and configured to convert incident light to a charge;
a floating diffusion formed from an implant of the second conductivity type;
a transfer gate configured to transfer the charge from the photodetector to the floating diffusion; and
an anti-punchthrough implant formed from an implant of a dopant of the first conductivity type and having a concentration such that a region of the substrate proximate to the floating diffusion has a higher concentration of dopant than a region of the substrate proximate to the photodetector.

17. The pixel of claim 16, wherein the anti-punchthrough implant extends generally from a midpoint of the transfer gate into the floating diffusion.

18. The pixel of claim 16, wherein the anti-punchthrough implant comprises a first implant region at a first depth and a second implant region at a second depth which is greater than the first depth.

19. The pixel of claim 18, wherein a peak concentration of dopant of the frist implant region is approximately 0.3 microns from a surface of the substrate and a peak concentration of dopant of the second implant region is approximately 0.6microns from the surface of the substrate.

20. The pixel of claim 16, wherein a dopant concentration of the anti-punchtrough implant proximate the floating diffusion is in a range from 3e16 to 6e16.

21. The pixel of claim 16, wherein a dopant concentration of the anti-punchtrough implant proximate the midpoint of the transfer gate is in a range from 3e15 to 6e15.

22. A method of operating a pixel having a substrate of a first conductivity type, a photodiode of a second conductivity type which is opposite the first conductivity type, a floating diffusion of the second conductivity type, a pinning layer, and a transfer gate, the method comprising:
providing a transfer region extending between the floating diffusion and the photodiode and having an asymmetric concentration of a dopant of the first conductivity type such that a concentration of the dopant is greater proximate to the photodiode than proximate to the floating diffusion; and
converting light incident upon the photodiode to a charge.

23. The method of claim 22, wherein providing the transfer region includes providing a channel region of the first conductivity type from approximately a midpoint of the transfer region to at least across the photodiode, the channel region being formed by implanting the dopant of the first conductivity type such that a concentration of the dopant in the transfer region is greater proximate to the photodiode than proximate to the floating diffusion.

24. The method of claim 23, further comprising forming an anti-punchthrough implant extending generally from a midpoint of the transfer gate into the floating diffusion, the anti-punchthrough implant being formed by implanting a dopant of the first conductivity type such that a region of substrate proximate the floating diffusion has a higher concentration of dopant than a region of the substrate proximate the photodetector.

25. The method of claim 24, wherein forming the anti-punchthrough implant includes forming a first implant region at a first depth and a second implant region at a second depth which is greater than the first depth.

26. The method of claim 24, wherein forming the channel region and anti-punchthrough implant includes employing a first mask to form the channel region and a second mask to form the anti-punchthrough implant.

* * * * *